US005877961A

United States Patent [19]

Moore

[11] Patent Number: 5,877,961
[45] Date of Patent: Mar. 2, 1999

[54] ELECTRONIC SUPPORT WORK STATION AND METHOD OF OPERATION

[75] Inventor: William C. Moore, Waynesboro, Va.

[73] Assignee: Genicom Corporation, Waynesboro, Va.

[21] Appl. No.: 719,009

[22] Filed: Sep. 24, 1996

[51] Int. Cl.⁶ .............................. G06F 19/00; G06G 7/64; G06G 7/66

[52] U.S. Cl. ............................... 364/474.22; 364/474.24; 364/468.12; 364/468.17; 364/579; 395/51; 395/68; 395/77; 705/1; 705/29

[58] Field of Search ........................ 364/474.22, 474.37, 364/468.17, 490, 507, 579, 474.23, 474.24, 474.16, 468.16, 468.12, 468.28, 468.22, 481, 491, 474.21, 488, 489; 395/51, 61, 68, 77, 916; 705/1, 29; 371/24, 26; 707/104, 103, 102

[56] References Cited

U.S. PATENT DOCUMENTS

| | | | |
|---|---|---|---|
| 4,396,977 | 8/1983 | Slater et al. | 364/188 |
| 4,469,553 | 9/1984 | Whitehead | 156/627 |
| 4,709,337 | 11/1987 | Knapp et al. | 364/468 |
| 4,796,206 | 1/1989 | Boscove et al. | 364/551.01 |
| 4,837,502 | 6/1989 | Ugenti | 324/738 C |
| 4,847,795 | 7/1989 | Baker et al. | 364/579 |
| 4,899,292 | 2/1990 | Montagna et al. | 364/521 |
| 4,914,873 | 4/1990 | Newhouse | 52/36 |
| 5,001,714 | 3/1991 | Stark et al. | 371/26 |
| 5,043,910 | 8/1991 | Chiba | 364/489 |
| 5,075,876 | 12/1991 | Seki et al. | 395/121 |
| 5,086,397 | 2/1992 | Schuster et al. | 364/468 |
| 5,088,054 | 2/1992 | Paris, II | 395/121 |
| 5,146,404 | 9/1992 | Calloway et al. | 364/401 |
| 5,195,173 | 3/1993 | Gordon et al. | 395/60 |
| 5,239,487 | 8/1993 | Horejsi et al. | 364/552 |
| 5,325,582 | 7/1994 | Glaser et al. | 29/840 |

*Primary Examiner*—Reba I. Elmore
*Assistant Examiner*—Ramesh Patel
*Attorney, Agent, or Firm*—Nixon & Vanderhye

[57] ABSTRACT

A computer-controlled electronic support system includes an electronic work station with a display screen and pointing device coupled to a central processing unit where an operator performs an operation on a workpiece. The workpiece operation begins by an operator entering and processing a work order identifier. In response to that work order identifier, a corresponding workpiece identifier is generated. Image, graphic, and text information associated with that workpiece identifier is retrieved from memory. A user-friendly, menu-based display screen provides a plurality of entries with each entry having menu options associated with the workpiece identifier. Advantageously, an operator can select any one of several different images of the workpiece simply by selecting a menu option. Not only is the particular workpiece image displayed, but also a plurality of graphics associated with that workpiece image. The graphics may include for example icons and "hot spot" areas of the displayed image, any one of which may be selected by the operator simply pointing to the graphic on the display screen. In response, information is displayed relating to the workpiece corresponding to the selected graphic that will assist the operator in performing a particular support operation on the workpiece, e.g., maintenance, servicing, testing, repair, etc.

49 Claims, 11 Drawing Sheets

ELECTRONIC SUPPORT WORK STATION AND METHOD OF OPERATION

FIELD OF THE INVENTION

The present invention relates to electronic maintenance support technology, and more particularly, to computer work stations and computer-based methods used to provide electronic support for the maintenance, service, testing, and/or repair of manufactured products or systems.

BACKGROUND AND SUMMARY OF THE INVENTION

With increasing complexity of manufactured products and systems, there is an ever increasing need to apply digital electronic technology to provide electronic support for the maintenance, service, testing, and/or repair of those manufactured products and systems. The goal of this support should be to provide more economic, more efficient, and higher quality control over maintenance, service, testing, and repairs. The present invention achieves this important goal by providing an integrated electronic support work station that is both user friendly and capable of performing multiple complex tasks.

A work station operator is provided with a menu-driven interface to an electronic maintenance support computer control system which can be readily used by an unskilled operator to obtain displays of text and graphic information relating to various workpieces/products/systems to be maintained, repaired, tested, or otherwise serviced by the operator. In the course of description, mention may be made to any one of a number of workpiece support activities: maintenance, repair, testing, service, etc. It will be understood that the present invention is applicable to these and other similar supporting activities. One example workpiece is an electronic printer.

A computer-controlled electronic support system includes an electronic work station with a display screen and pointing device coupled to a central processing unit where an operator performs an operation on a workpiece. The workpiece operation begins by an operator entering and processing a work order identifier. In response to that work order identifier, a corresponding workpiece identifier is generated. Image, graphic, and text information associated with that workpiece identifier is retrieved from memory. A user-friendly, menu-based display screen provides a plurality of entries with each entry having menu options associated with the workpiece identifier. Advantageously, an operator can select any one of several different images of the workpiece simply by selecting a menu option. Not only is the particular workpiece image displayed, but also a plurality of graphics associated with that workpiece image. The graphics may include for example icons and "hot spot" areas of the displayed image, any one of which may be selected by the operator simply pointing to the graphic on the display screen. In response, information is displayed relating to the workpiece corresponding to the selected graphic that will assist the operator in performing a particular support operation on the workpiece, e.g., maintenance, servicing, testing, repair, etc.

With respect to graphic icons, each icon corresponds to a particular function to be performed on the workpiece. Advantageously, each icon has a image that identifies or suggests the particular function associated with that icon. Accordingly, the shape of the icon image itself prompts the operator to perform a particular function; when selected, it provides the operator with additional information and/or explanation on how to perform that function on this particular workpiece. Icons might include for example a "wrench" icon that can be selected to instruct the operator to adjust some aspect of the workpiece.

Another very helpful example icon shaped like a pair of binoculars may be selected by the operator on the displayed image to cause a more detailed image of the particular component or part or portion of the display image with which the binoculars icon is associated to be displayed.

The graphics also include outlined images referred to as "hot spots" of each displayed workpiece image. Each outlined area corresponds to a part or component of the workpiece. When the operator points to one of the hot spots, a corresponding part or component identifier, part or component name, and/or part or component description is immediately displayed. If this part or component is desired, the operator simply "clicks" on the mouse pointing device to have the work station electronically order that part after reviewing order.

Another of the menu entries is a troubleshooting menu for assisting the operator with diagnosing a problem with the workpiece and providing a suggested solution to the diagnosed problem. Once the workpiece type has been identified, the operator selects the troubleshooting menu entry which causes a first list of potential problems relevant to that identified workpiece type to be displayed. The operator may then select one of the potential problems from the list which causes a second list of potential solutions related to that problem to be displayed. The operator may use that solution to perform a workpiece operation. The work station automatically maintains an electronic history of operations performed on the workpiece at that electronic work station including any solutions selected from the list. If an operator detects a problem and provides a "new" solution not included on the list, that new solution may be added to the solutions list for that particular problem for that workpiece type.

While the electronic work station may be used as a stand-alone device, it is preferably advantageously used in the context of a network in conjunction with other electronic work stations and a main computer. The main computer includes sufficient memory to store information relating to a number of different workpieces accessible by all of the electronic work stations on the network.

Accordingly, both images and graphics are presented to an operator to illustrate various views of the workpiece being serviced along with display of helpful text instructions and/or comments to guide the operator in the most efficient and effective manner to provide the necessary service. Using this user-friendly but also comprehensive electronic work station, even an operator lacking skill with computers or knowledge of a particular workpiece is able to effectively and efficiently service a variety of different workpieces. In order to integrate as much information as possible pertaining to a particular product or workpiece, the electronic work station in accordance with the present invention employs advantageous data structures to quickly and effectively access the pertinent image, graphic, and text information using a workpiece identifier. The integrated nature of these data structures facilitates coordination of workpiece service operations for a large number of different workpieces at multiple work stations and also facilitates such functions as parts identification, procurement, inventory, testing, quality assurance, shipping, overall management/accounting, etc.

BRIEF DESCRIPTION OF THE DRAWINGS

These and other objects of the present invention as well as specific example embodiments of the invention will now be described in conjunction with the following drawings in which like reference numerals refer to like elements.

DETAILED DESCRIPTION OF THE PREFERRED EMBODIMENT

In the following description, for purposes of explanation and not limitation, specific details are set forth, such as particular workpieces, parts, tables, icons, computer interfaces, and data processing techniques, etc. in order to provide a thorough understanding of the present invention. However, it will be apparent to one skilled in the art that the present invention may be practiced in other embodiments that depart from the specific details. In other instances, detailed descriptions of well known methods, devices, and circuitry are omitted so as not to obscure the description of the present invention with unnecessary detail.

Figure 1:
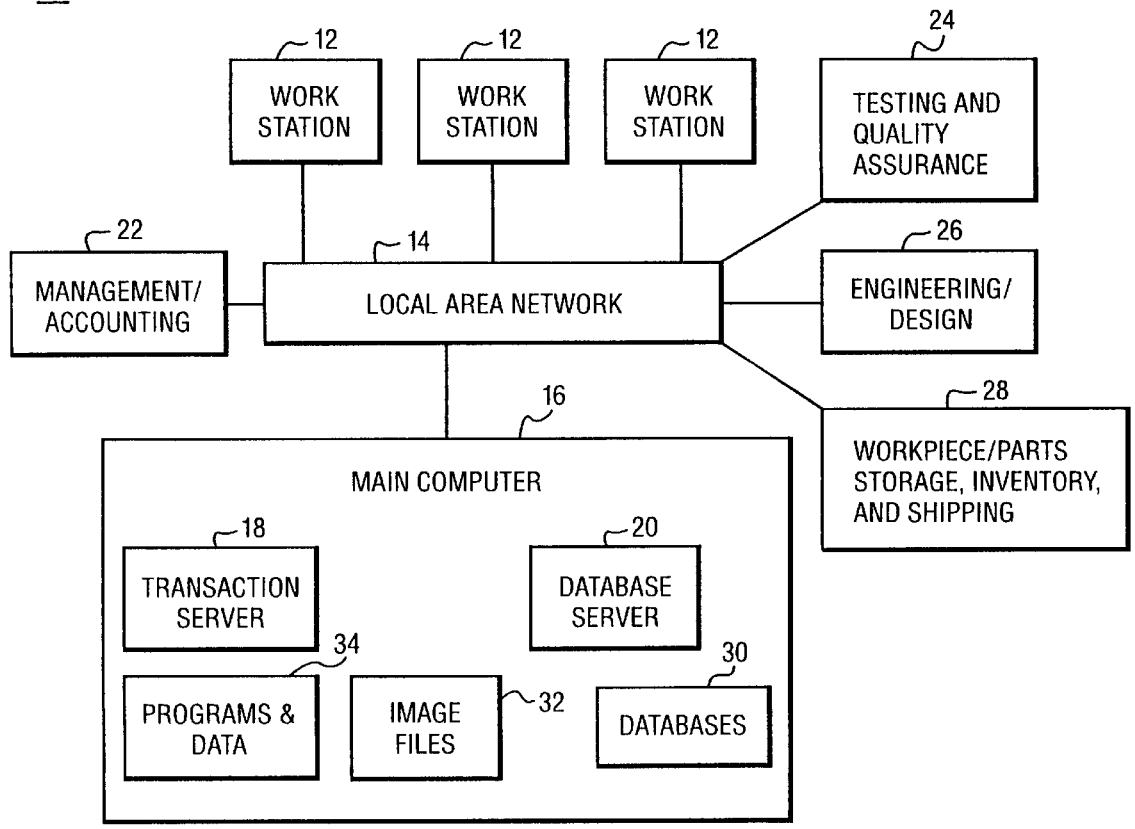
FIG. 1 is a function block diagram of an electronic support system in accordance with a preferred embodiment of the present invention.

Referring to FIG. 1, an overall block diagram of an electronic maintenance and support system according to the present invention is shown. The system comprises a host network 14 such as a local area network (LAN) connected to a main or host computer 16. The main computer may be for example a mainframe computer available from COMPAQ. Also attached to the host network 14 are a number of work station computers 12 ("work station" here being used in the sense of the station where an operator performs support work) which may be for example commercially available personal computers (PCs). Work station 12 may also be for example a more sophisticated computer such as a "SUN" work station available from SUN Microsystems. Other optional computers connected to the host network 14 may include a management/accounting computer 22, a testing and quality assurance computer 24, an engineering design computer 26, and a workpiece/parts storage, inventory, and shipping computer 28.

The plural work stations 12 are attached to the network and are readily used by operators who need not be skilled in the use of computer technology to efficiently and effectively perform various maintenance, repair, testing, service, and/or other support functions on workpieces. For purpose of the present invention, the term "workpiece" is adopted as a general term to describe a product, apparatus, assembly, system, or some portion thereof to be maintained, repaired, tested, or otherwise serviced. Each workpiece may include a number of component parts. Moreover, while the present invention is described in the context of electronic maintenance, repair, testing, and/or servicing, the present invention has broader application. For example, the present invention may be used in the manufacture (computer-automated or otherwise) or remanufacture of workpieces.

Main computer 16 functions as a "server" type computer to the network serving the requests of the other "client" computers attached to the network 14 like work stations 12 and includes among other things transaction server 18, database server 20, various databases 30, image files 32, and program and other data storage 34. The image files which typically require substantial memory may be stored for example on laser optical disk as well as other types of storage media. The main application programs controlling the work stations 12 may be written in a variety of languages, for example. Microsoft Visual Basic 3.0.

Each of the "client" type computers 12, 22, 24, 26, and 28 connected to the network 14 may execute as an example user interface Microsoft Windows 3.1 with MS DOS 6.2. The database server 20 may be any database software capable of supporting remote, multi-user access, e.g., Microsoft Access 2.0. The transaction server 18 may be any software which supports inventory transactions and order processing either through terminal emulation or remote procedure commands (RPC), as is employed for example in NETWARE 3.12. Example transaction server application programs include ASKMAN running on an HP3000 995/100 and METRIX UPTIME running on an HP3000 980. The network 14 connections and communications may be in conformance with industry accepted standards such as the IEEE Ethernet Standard 802.3 with the various work stations and computers connected into a ten base five backbone for example. Various communications software packages are available to handle communications requests from each work station 12 to the transaction server, e.g., REFLECTIONS available from Walker, Richer, and Quinn.

The information in databases 30 and image files 32 is accessed using a number of table relationships. These table relationships are used to display images, graphics, and text with respect to a particular workpiece being serviced, e.g., troubleshooting tables; tables linking work order, workpiece number, serial number, and part number; functional test tables; audit log tables; part and inventory request tables, etc. The relationships between such database tables may advantageously be based on a single work order number identified with the maintenance, repair, testing, or service to be performed on a particular workpiece and a workpiece number identified with that particular type of workpiece.

Figure 2:
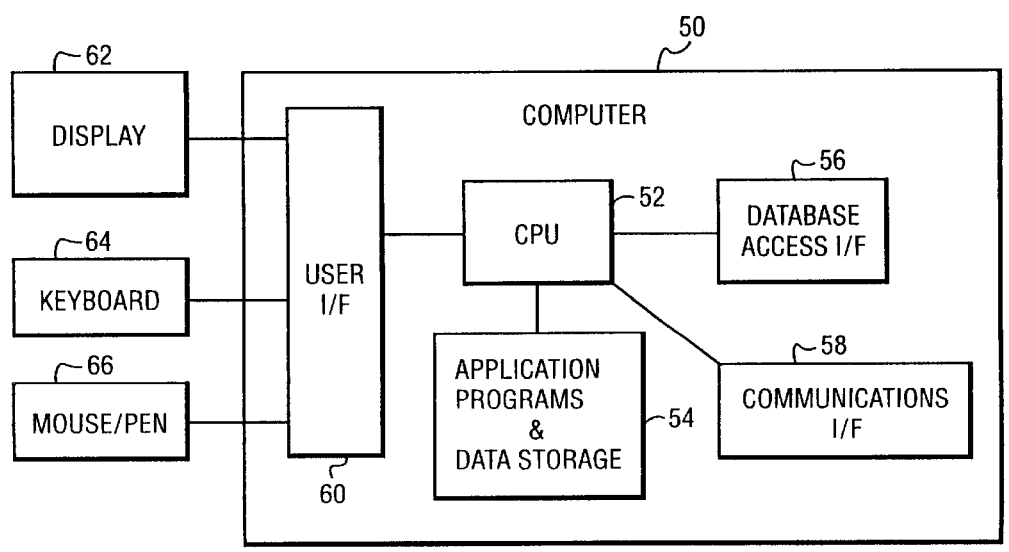
FIG. 2 is a function block diagram of an integrated electronic support work station in accordance with the preferred embodiment of the present invention.

FIG. 2 is a function block diagram of a work station 12 which may be used in accordance with the preferred embodiment of the present invention. Work station 12 includes a computer 50, display 62, keyboard 64, and mouse and/or light pen pointing devices 66. Computer 50 includes a central processing unit 52 which executes various application programs stored in memory 54. The CPU interfaces with display 62, keyboard 64, mouse/pen 66 through a user interface 60. Database access via host network and database server 20 in the main computer 16 is by way of database access interface software 56. Communications between CPU 52 and transaction server 18 in the main computer are by way of communications interface software 58. Memory 54 includes sufficient memory for data storage for loading and storing information from main computer 16 relevant to the maintenance, repair, and servicing of a particular workpiece.

To more fully explain this table structure and the present invention, the following example is referenced throughout the detailed description. The workpiece to be serviced, repaired, maintained, etc. corresponds to a particular printer identified by the printer manufacturer as LA75-A2. An operator inputs a work order request to begin. The work to be performed on the printer is associated with a unique work order number at the main computer 16. In a workpiece data table, the main computer 16 searches for and retrieves a workpiece ID corresponding to that work order and obtains a workpiece ID "1181," and a workpiece number LA75-A2 which corresponds to the printer LA75-A2.

For each workpiece ID, there is associated in a "FRAMES" database table one or more image frames. All of the images which may be selected by an operator pertaining to this particular workpiece number are selected from the FRAMES table by FRAME ID as indicated below in Table 1.

TABLE 1

| WPID | NAME | FRAMEID |
|---|---|---|
| 1181 | LA75A2.BMP | 1 |
| 1181 | 1030.BMP | 2 |
| 1181 | 1031.BMP | 3 |
| 1181 | 1033.BMP | 4 |
| 1181 | 1035.BMP | 5 |
| 1181 | 1032.BMP | 6 |
| 1181 | 1037.BMP | 7 |
| 1181 | 1038.BMP | 8 |
| 1181 | 1040.BMP | 9 |
| 1181 | 1036.BMP | 10 |
| 1181 | 1041.BMP | 11 |
| 1181 | 1039.BMP | 12 |
| 1181 | 1034.BMP | 13 |
| 1181 | 1047.BMP | 14 |

In this example, Table 1 includes 14 FRAME IDs corresponding to 14 different names of 14 different views for the workpiece (printer) corresponding to workpiece ID 1181.

The FRAME names are then used as a "key" or "address" to another "pictures" or PICTITEM database table (an example is shown in Table 3 below) which contains the specific filename for the image file that resides in image files memory 32. The FRAME IDs are used to select appropriate hot spots and icons from the PICTITEM database Table 3 below. The FRAME ID is also used to sort the frames when they are displayed in the VIEWS menu described below in conjunction with FIG. 4. In this case, each image file is a bitmap type image file showing a particular view of the printer such as perspective view, a top view, a top view with panels removed, etc.

The database bitmap names, e.g., 1032.BMP, from the database tables are used as keys or addresses into other database tables such as Tables 2 and 3 below that contain "hot spot" images and icon images to be displayed along with a particular bitmap picture. Table 2 shown immediately below is a database table which associates the FRAME name with the filename for the image so that the same image can be used for different workpieces. The FRAMES database Table 1 and the PICTITEMS database Table 3 are used to identify/specify an individual workpiece.

TABLE 2

| NAME | FILENAME | DESCRIPTION |
|---|---|---|
| 1032.BMP | 1032.BMP | Top covers removed |

A display "hot spot" is an area of the displayed image that is preferably (but not necessarily) outlined which typically encloses or otherwise indicates some portion of the imaged workpiece. Each hot spot may be selected by an operator to identify a particular subassembly, part, or other workpiece element that may require checking, maintenance, repair, testing, or other service. In the example where the top view image of the printer is displayed with the top covers removed, a hot spot may be positioned for example about, on, or adjacent to the printhead. A user selecting that hot spot with a light pen, mouse, keyboard, or other display screen pointing device causes the work station to generate an overlaid display, e.g., a text message, preferably near the hot spot which identifies for example the print head, its part number, and part description.

In one example embodiment, each hot spot is defined by a rectangular area on the display screen having its rectangular display screen coordinates stored within the PICTITEMS database Table 3 shown below.

TABLE 3

| NAME | OBJECT TYPE | TOPX | TOPY | BOTX | BOTY | ITEM | NOTE |
|---|---|---|---|---|---|---|---|
| 1032.BMP | Adjust | 3450 | 4170 | 3450 | 4170 | | Set print head gap .010–.020 1032.BMP |
| 1032.BMP | Note | 6795 | 375 | 6795 | 375 | | Check for leaking capacitors and cracked insulation |
| 1032.BMP | Line | 5250 | 1125 | 7020 | 705 | | |
| 1032.BMP | Lub | 5865 | 4065 | 5865 | 4065 | | Lubricate carriage shaft rings |
| 1032.BMP | Hot Spot | 4560 | 4485 | 4935 | 4680 | 1 | |
| 1032.BMP | Zoom | 1860 | 2865 | 1860 | 2865 | ZM1 | Gear detail |

The PICTITEMS table also includes information pertaining to graphical icons identified with a particular bitmap image that may be displayed on the current workpiece image/view along with hot spots. In the example relating to servicing the LA75-A2 printer, four icons may be displayed at appropriate locations on the current view of the printer being displayed for selection by an operator using a display pointing device: including an Adjust icon, a Note icon, a Lubricate icon, and a Zoom icon. These specific example icons aid the operator in the servicing of printers. Selection of one of the icons displays helpful information regarding how to adjust a part, examine a part for looking for signs of wear or disrepair, how to repair, service, or replace a part, what other related parts to examine, etc. X and Y coordinates (TOPX, TOPY, BOTX, and BOTY) for the top and bottom dimensions of rectangular boxes define the hot spot area and icon graphics on the work station display screen. Of course, hot spots and icons may be defined by a corresponding set of display screen coordinates.

The FRAME ID from the FRAMES database table along with the workpiece ID are the "key" into another database table referred to as the COMPONENTS Table 4. Each item in the components table relates to an item in the PIC-TITEMS table. The information in the COMPONENTS table is workpiece ID specific and provide detailed part descriptions, icon-related text (e.g., for a zoom icon), and/or other instructions or graphics which may be referenced in a particular bitmap picture as shown below in Table 4.

TABLE 4

| ASSYID | FrameID | Item | NextFrame | Part | Comments |
| --- | --- | --- | --- | --- | --- |
| 1181 | 6 | 1 | | 29-25916-00 | |
| 1181 | 6 | 12 | | 29-25918-00 | MECHAN-ICAL ASSY |
| 1181 | 6 | 23 | | 29-25958-00 | POWER SUPPLY ASSY |
| 1181 | 6 | ZM1 | 14 | | |

With this relational database table structure, a particular workpiece or part view/image along with its corresponding hot spots and icons may be readily accessed for use with multiple workpiece numbers which all share the same pictures/images but for which detailed parts and other information might be different.

The database tables employed in the present invention also advantageously use similar relational database techniques to link work order, workpiece number, part numbers, and serial numbers to image information, test information, tracking information, auditing information, documentation, engineering, auditing, inventory, management, and other information. In this way, the present invention advantageously provides an integrated information environment with no redundant data. The database structures provide for comprehensive analysis and reporting with minimum data storage requirements.

FIGS. 3(A)–3(E) are flowchart diagrams illustrating the basic operation of the work station 12 in the maintenance, repair, testing, and/or service of a workpiece. Beginning with FIG. 3(A), after logging onto the work station (for example, by entering a user ID and password), the operator is prompted to input a work order number (block 100). The work order number is formatted as a request and communicated via communications interface 58 over host network 14 to the main computer 16. The transaction server 18 processes the work order inquiry (if it has been previously entered) and returns from a workpiece database table the corresponding workpiece number and account number for that work order (block 106). However, if this is a new work order which has not yet been entered into the main computer workpiece database, the operator is queried for various information including for example workpiece serial number, workpiece type, etc. which is used by the main computer 16 to establish a work order record which is then stored by database server 20 in the appropriate database table (block 104). Creation of a new work order is the key into the repair history and the functional test history created by the user. The database server 20 in main computer 16 then searches the workpiece database table using a workpiece number corresponding to the work order and retrieves a corresponding workpiece ID (block 108). When loading such information into the electronic work station in a network-based system, the information is provided from the main network database server 20. Once the data is loaded into work station memory, it is then accessed. However, some information, such as workpiece "VIEWS" images, may be loaded on demand when the user requests a new view.

An application program in the work station computer 50 then initiates several database queries of information "keyed" to the ID number via database server 20 to retrieve from the various database tables described above the corresponding frame, picture, and component database table and image file information and store it in the work station data storage 54 in preparation for the maintenance, repair, testing, or other service to be performed on the current workpiece for this work order (block 110). In addition, work station computer 50 sends out commands to main computer 16 to retrieve work order repair history, audit log, troubleshooting information, testing and other instructions/data linked to this workpiece ID (block 112). These additional requests are executed using queries against the database server 20. In general, much of the accessed information may be "queried" from the database server 20. Example exceptions might include manufacturing transaction system related activities such as work order validation and parts ordering. These sets of related information are used as needed during service/repair/test/audit activities. This information may be loaded, even though it may not be needed initially, in order to minimize the number of requests/queries being made against the database server 20. This approach creates a burst of information flow and then relieves the server until updates are required.

Once the database and image file information pertaining to this work order/workpiece is loaded into the work station, the work order is formally commenced. The starting time is recorded for labor tracking purposes with a current accumulated direct labor for the work order being maintained for the operator's benefit along with a standard or typical repair time. The start and accumulated times are also recorded by the main computer database server for this work order thus making recovery from hardware failures independent of the work station itself. Since one function of the electronic work station is to keep track of expended labor, when a user starts a work order, the start time is written to the database server 20. If the work station computer 50 is aborted for some reason, the database server 20 knows the time when the user started. When the work station restarts, the database server therefore accounts for the elapsed time between the start time and the current time.

In performing the work order, the operator accesses a view or image for the workpiece by accessing a VIEWS menu screen. A decision is made (block 114) whether the operator has selected a particular view for this workpiece from the VIEWS menu. The menu screen list is linked to the Frames database table and is used as described above to access the corresponding bit map image via the Pictures database table. The descriptions of each bitmap filename are used as the VIEWS menu options.

Returning to the LA75-A2 printer example having a workpiece ID of 1181, a picture or image filename 1032.BMP corresponding to WPID 1181 and Frame ID 3 also corresponds to a printer view description "Top (Covers Removed)" and is listed as one of the VIEWS menu options on the display screen. If the operator selects this particular option from the VIEWS menu, control proceeds via flag A to the flowchart shown in FIG. 3(C).

Figure 3A:
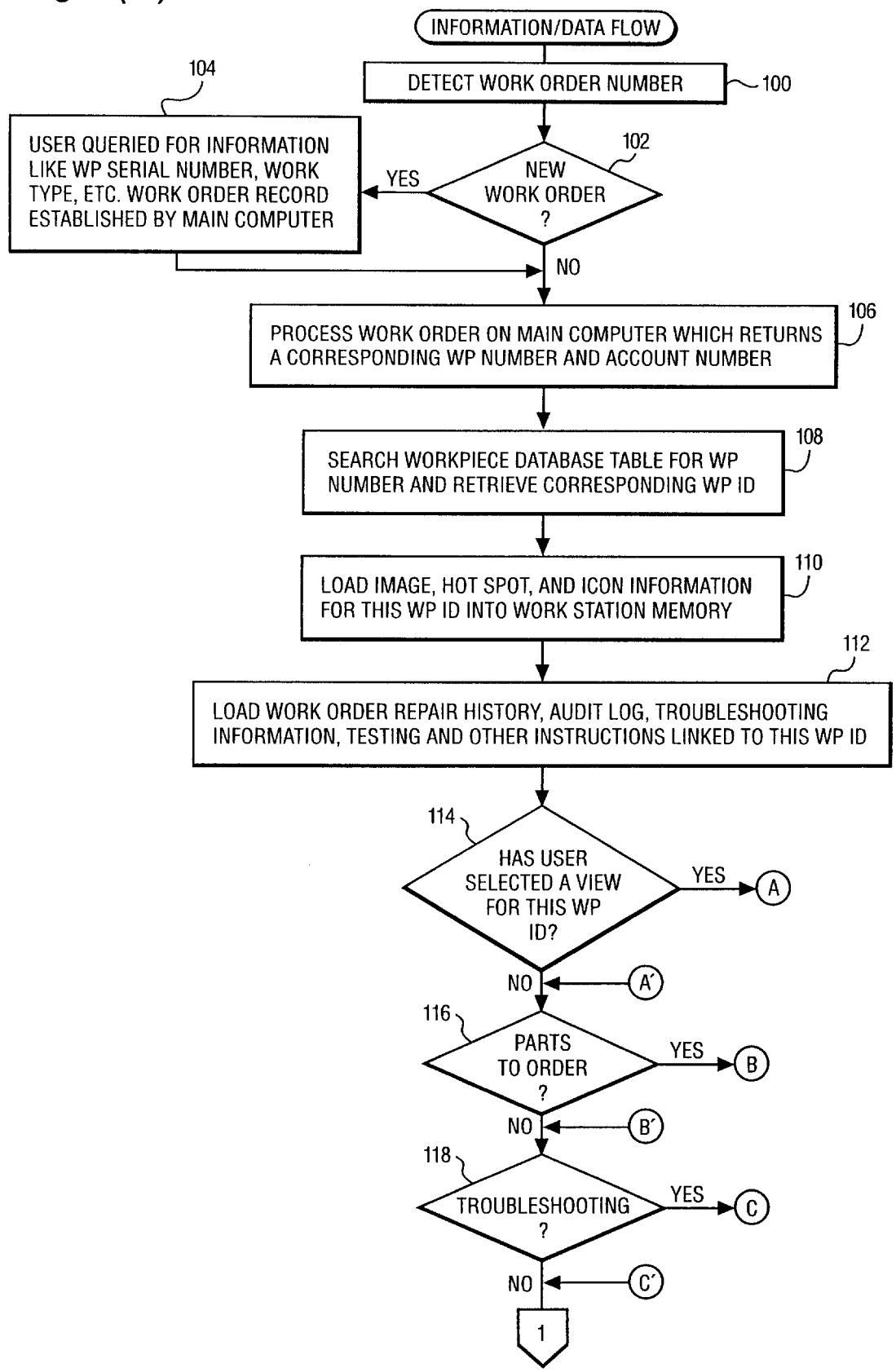
FIGS. 3(A)–3(E) are flowchart diagrams of the various operations that may be performed by the electronic support work station shown in FIG. 2.
Figure 3B:
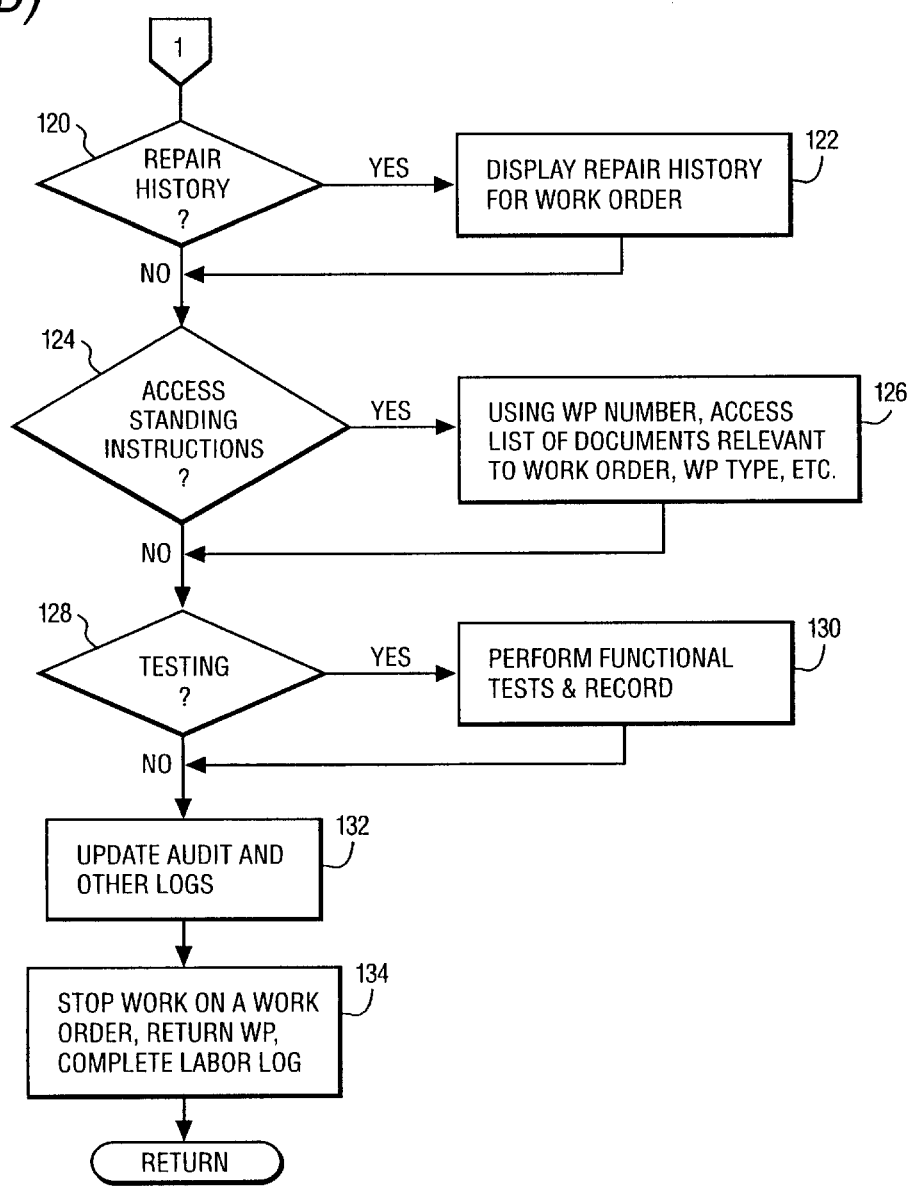
Figure 3D:
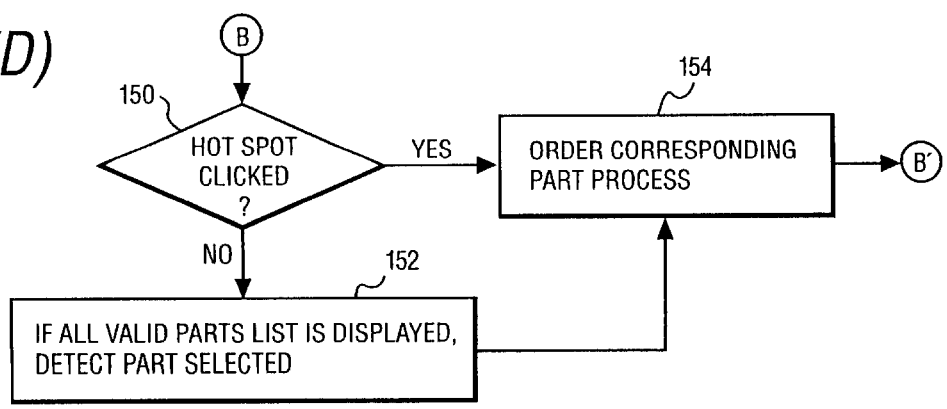
Figure 3C:
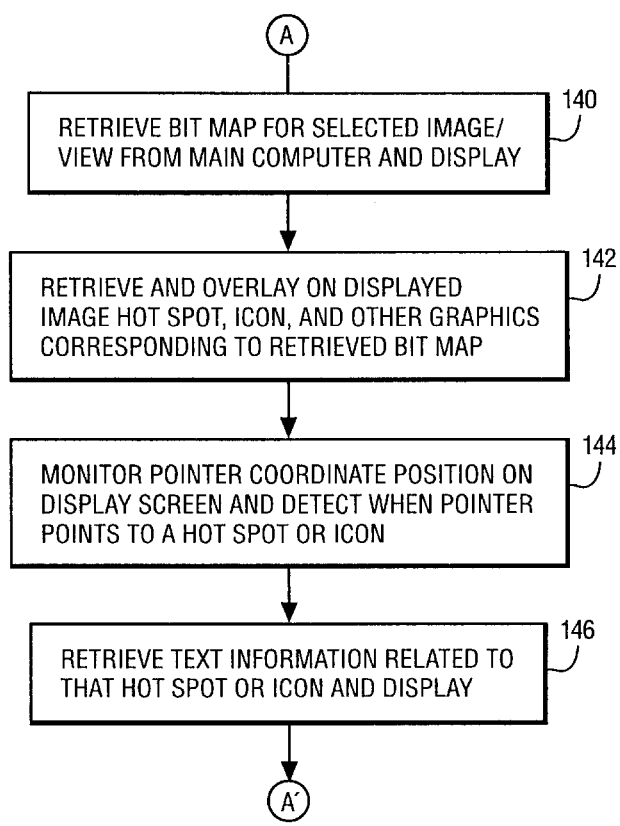

Referring to FIG. 3(C), the work station retrieves from data storage 54 the appropriate corresponding bitmap, in this case the image of the LA75-A2 printer from a top view with its covers removed as contained in file 1032.BMP (block 140). While much of the database-related information is retrieved during commencement of the work order, the images are preferably (although not necessarily) loaded on demand. Specifically, the bitmaps are accessed on demand from the database server 20. The memory media on which the images are stored depends on the desired implementation and the access times related to different storage methods. Compact optical disks may store the images if desired. Thereafter, any hot spots and/or icons linked to that displayed image by workpiece ID from the PICTITEM table and by workpiece ID and frame ID from the COMPONENTS table are retrieved and overlaid on the displayed printer VIEW image (block 142). Of course, other information such as documentation to be accessed by the work station may also be retrieved "on demand," especially if some or all of it will not necessarily be needed. Thus, when the user selects a view, the image is loaded from the database server 20, and using the data previously obtained from the server and stored in the work station, the work station displays the image with the hot spots and icons overlaid on it.

More particularly, for each of the PICTITEM elements for this view having an object type Hot Spot, work station CPU 52 draws a hot spot, e.g., a rectangle, on the printer view image using the TOPX, TOPY, BOTX, and BOTY coordinates for that element from Table 3. If there are plural hot spots, numbers may be displayed along with the rectangles over the displayed image. For object type "Adjust" in Table 3 corresponding to an adjustment icon, CPU 52 may display an adjustment icon which may be in the LA75-A2 printer example a wrench icon symbolizing mechanical adjustment which is placed at the TOPX and TOPY coordinates. For object type "L" corresponding to a line, CPU 52 draws a leader line between a hot spot or icon and a particular coordinate corresponding to an element or area in the displayed printer image, e.g., the printhead. These lines may be used in instances where the displayed image is too small or for the convenience of positioning the hot spot rectangles in the displayed image. Object type "Lub" corresponds to a lubrication icon. The CPU 52 may display, for example, an oil can icon placed at the TOPX and TOPY coordinates specified in the PICTITEM database table. For object type "Note," CPU 52 draws on the display screen a paper clip note icon at the TOPX and TOPY coordinates specified in the database table. For the object type "Zoom," CPU 52 may display a binoculars icon placed at the TOPX and TOPY coordinates specified in the PICTITEM table. The "zoom" icon includes an additional item of detail specified in the PICTITEM database table used by the CPU 52 to access and display another more detailed view when the "zoom" icon is selected by the operator on the display.

As the operator passes a mouse/light pen pointer over the displayed image, CPU 52 monitors the pointer coordinate location and constantly checks to see if the pointer is over a hot spot or an icon (block 144). When the pointer is adjacent to or overlaps a hot spot or icon, the CPU 52 retrieves from the PICTITEM database table appropriate information text and/or graphics related to the hot spot or icon (block 146). For example, the text information might include part identification/description text, instructions for maintenance, repair, service relating to a particular part, more detailed views of a particular part, etc. Control returns to the main data flow at flag A'.

The work station CPU 52 manages images which are larger than the display screen area by allowing the operator to scroll the image using for example horizontal and vertical scroll bar controls either on the mouse 66 or on keyboard 64. All of the hot spot or icon objects drawn on the display image/view are scrolled along with that image.

If an operator determines that a new part is necessary for example to repair the workpiece, several methods are available for ordering that part. First, the operator may point to the hot spot corresponding to the part to be ordered using the mouse 66 and click once on the hot spot. The selected part is then ordered by clicking a work order menu option available on the main menu screen. Second, the operator may point to the hot spot corresponding to the part to be ordered and double click the mouse 66 to initiate the parts order process. An operator may also wish to list all of the valid parts that can be selected for this particular workpiece. To do so, the operator selects the menu option "list all valid parts" from the order sub-menu. From that list, the operator selects the part option corresponding to the desired part and double clicks that selection. The operator can verify that the part selected is in fact the one the operator desired to order by having the CPU 52 display the image of the part selected along with its corresponding hot spot number. If the hot spot number is different from that shown in the original image, the operator can easily detects that the wrong part was selected from the parts list.

The parts order process is initiated in decision block 116 via flag B illustrated in FIG. 3(D). The decision is made whether a hot spot is selected by the operator (block 150). If so, the CPU 52 places an electronic order corresponding to the desired part (block 154). If a hot spot has not been clicked, the operator is selecting the part from the all valid parts list with the part selected from the list being detected in block 152 and the corresponding order being placed by the CPU 52 in block 154. Control returns to the main data flow via flag B'.

The parts order process may be implemented in a number of different fashions. For example, if the part requested is a stock part, a record is created and stored in a database table that stores the operator, work order, part number, and quantity requested. Then when the parts are ready to be ordered, the user selects the order parts option from the main menu. The main computer 16 will cycle through the list of parts and perform the necessary transaction to obtain and deliver the necessary parts. The operator may also generate restocking requests to replenish parts and also to return unused parts. All these transactions are monitored by the transaction server and used to update the main computer's system-wide workpiece/parts storage inventory.

Figure 3E:
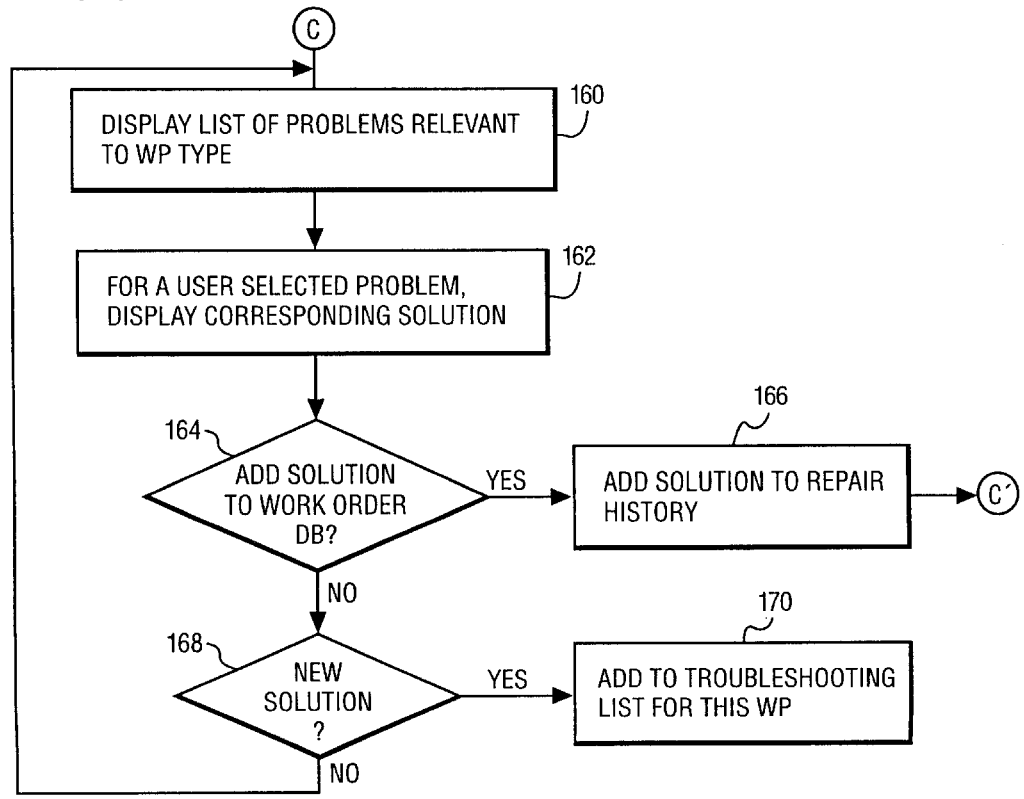

If an operator desires troubleshooting information in decision block 118, control proceeds via flag C to FIG. 3(E). CPU 52 generates a list of general problems relevant to this entire workpiece, and in the example of the LA75-A2 printer, the troubleshooting list lists various problems that have been encountered for that particular printer (block 160). The operator may select a particular problem from the list using the mouse pointer 66, and in response, CPU 52 displays a list of solutions for that particular problem. As described above, each problem and its list of solutions are linked by the workpiece ID for the work order and may be accessed independently of as well as together with the images and hot spots using that workpiece part number (block 162).

The work station computer 50 records the repair history for the work order. When the troubleshooting solution list is displayed, the operator may "double click" with the mouse pointer 66 the solution which the operator used in servicing the workpiece. CPU 52 then adds this selected solution to the work order repair history (block 166). The operator may also add a new solution not listed in the all solutions list by selecting the menu option "add solution" from the troubleshooting solutions list. This selection (block 168) prompts the operator to add the new solution to the troubleshooting list for this workpiece (block 170). The newly added solution is then added to both the repair history for the work order (block 66) and to the problem/solution database. The newly added solution may be made unavailable to other operators on the network until it has been reviewed by management or engineering (for example via computers 22 or 26) for acceptability. At any time, the user can review the repair history for the work order by bringing up a work order log screen from the main menu. By selecting the repair history list box, a repair history list for the work order is displayed.

Control returns to the main data flow via flag C' with continued description of the main data flow continued in FIG. 3(B). The repair history decision block 120 and display repair history for work order (block 122) are shown in FIG. 3(B). A decision is made (block 124) whether the operator desires to access standing instructions, i.e., documents which contain descriptive information such as testing instructions or general information such as how to follow a particular process. There are several types of documents relevant to a particular workpiece number which may be accessed by pressing a workpiece standing instruction (SI) button on the main display screen which causes a list of documents associated with the workpiece number for the work order to be displayed (block 126). These work station functions assist in obtaining or facilitating the adherence to the requirements of ISO 9002 because ISO 9002 certification requires that there be a well-controlled process of providing documentation to individuals. The certification requires that there be processes in place which guarantee that when an individual uses or views a document that the version which they are using is the latest approved revision. The work station guarantees this adherence because the document only exists in one place, i.e., the database server 20. All users accessing the document are assured of viewing the same version. As the documents are released to the users, they replace the original document and therefore provide complete revision control.

A decision is made in block 128 whether any testing is to be performed. If so, CPU 52 performs functional tests associated with the workpiece number for the work order based on a desired test selected from the test menu on the main screen (block 130). For example, tests performed may be designed to serve two purposes. First, they assist in the determination of the problem with the printer. Because of the printer characters and the arrangement of the printer characters, certain tests help determine that the printhead is not aligned properly or that the wires in the printhead itself are not all working. A second purpose of the tests might be to provide a summary of the printer's ability to execute various types of printing which it might be called upon to perform, such as letter quality versus draft quality or 10 CPI versus 12 CPI. The CPU 52 records each test as performed in the work order database.

In block 132, the work station computer updates an existing audit log for the work order. An operator can review the work order audit log by selecting the audit log option from the main menu work order log screen. The ability for the repair technician to review and respond to the audit log is useful simply because it is "electronic" and therefore always available/accessible. Moreover, it eliminates manual paperwork, and provides a means to capture through the database, the association between a failure and the corrective action taken. This information may also be used to assess or otherwise measure quality.

In block 134, after work has been completed on a particular workpiece, the operator selects a stop work order option from the main menu. In response, CPU 52 initiates a work order closure procedure. The closure procedure may include a number of bookkeeping and updating procedures. For example, the user is shown any open screens, audit logs, parts selected to be ordered but not ordered, etc. and prompts the user to resolve these issues. The work station computer 50 also determines if all required functional tests for the workpiece were performed and informs the operator accordingly. In addition, a labor entry screen is displayed to prompt the operator to provide a full accounting of all elapsed time. Labor can be distributed among other predefined labor categories or indirect categories. As labor is entered into a category, remaining unassigned time is updated, as well as the cumulative totals for both direct and indirect labor. The labor screen is displayed until all time has been assigned.

All of the information which is captured at a particular work station is accessible for reporting and analysis. A good example of this is when a repair technician begins work on a printer, the work station may query the database to see if the printer has been processed previously on another work order. The information from the previous work order may then be made available to the repair technician. Another example might be using the statistical frequency of repair history as a guide to the repair process itself. If 50% of the time a particular printhead needs replacement, then the work station may suggest replacing the printhead as a first course of action to help reduce the repair time.

Illustrative display screens showing the electronic support work station in example operation consistent with the LA75-A2 printer work order example are now described in conjunction with FIGS. 4–10.

Figure 4:
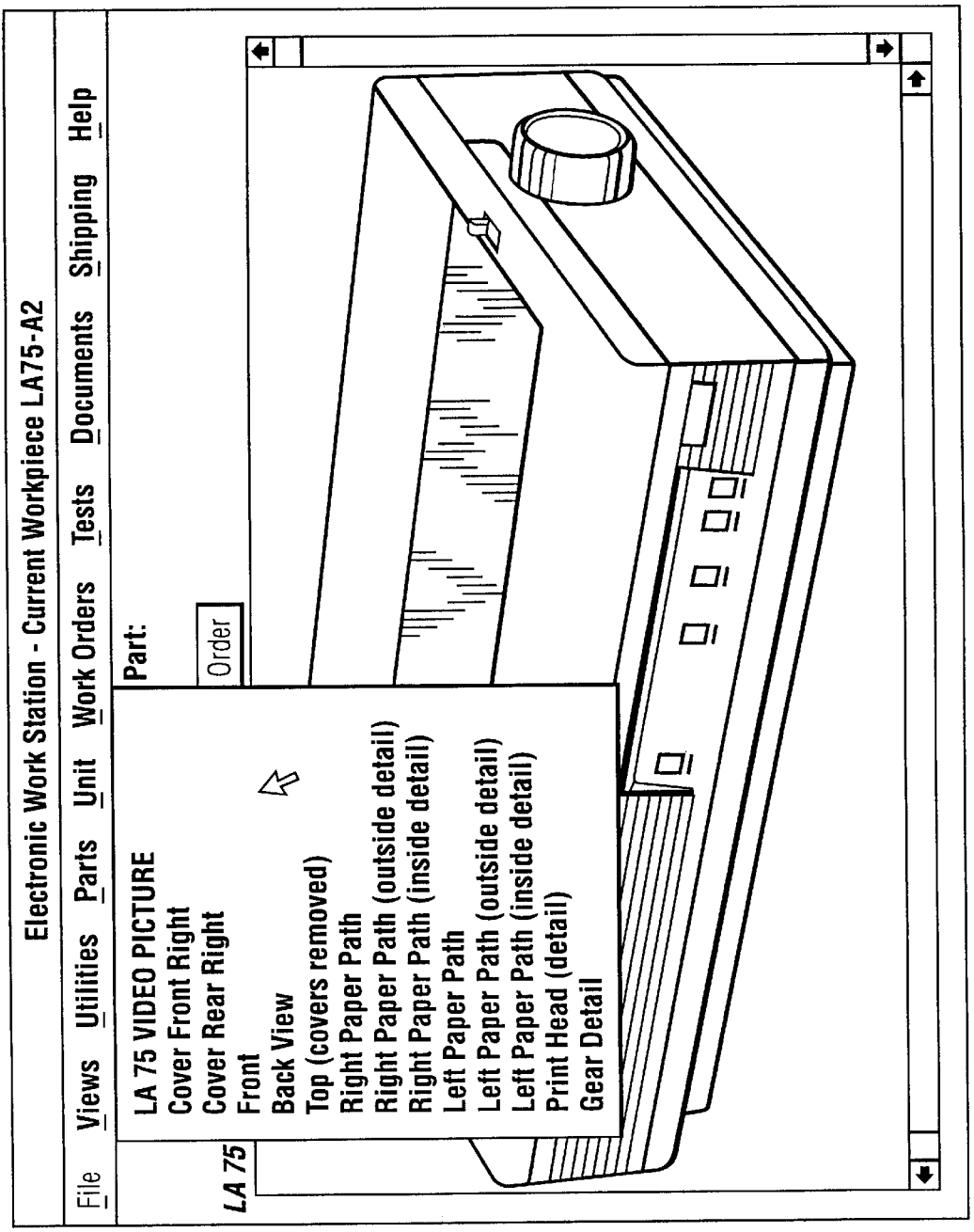
FIG. 4 is an illustrative electronic work station display screen showing an example view of a workpiece as well as additional views that may be displayed for that workpiece.

FIG. 4 shows an illustrative configuration of the work station display screen on the display 62 for assisting an operator in maintaining, servicing, testing, or repairing the current workpiece; in this case, printer LA75-A2 is displayed in a general perspective view. A main menu is configured at the top of the display screen and includes the following menu of categories: File, Views, Utilities, Parts, Unit, Work orders, Tests, Documents, Shipping, and Help. Each of these menus may be configured in well-known, pull-down menu format.

The various Views menu options available for viewing the LA75-A2 workpiece are listed in FIG. 4 including the general perspective view of the printer labeled LA75 video picture, along with various more specific views. For example, the "Top (Covers Removed)" menu option displays an image of internal hardware and other parts of the printer. The "right paper path" menu option provides a more detailed view of the right-side paper path view of the printer. The print head and gear menu options are examples of more detailed images of specific components within the printer.

The Utilities menu may include such options as "Work station lock out," "Change password," "Read messages," as well as the "All solutions" listing pertinent to the LA75-A2 workpiece. The Parts menu option may include the following options: "Find a part," "List all valid parts," "Request to add a current part," "Show parts ready to order," "Order parts," "Return part," and a part restocking request. The Unit menu may include menu options: "Unit log sheet" and "Troubleshooting." The unit log sheet captures specific information about a workpiece or part as identified at receipt. Such information might include the condition of the packaging and the unit which is then accessible to the repair technician. The Work orders menu may include the following options: "Work order shortages," "work order log," "Start and stop work order," "Validate work order," and "Check for required tests." The tests, documents, shipping, and help menus also provide various useful options for assisting the operator.

Figure 5:
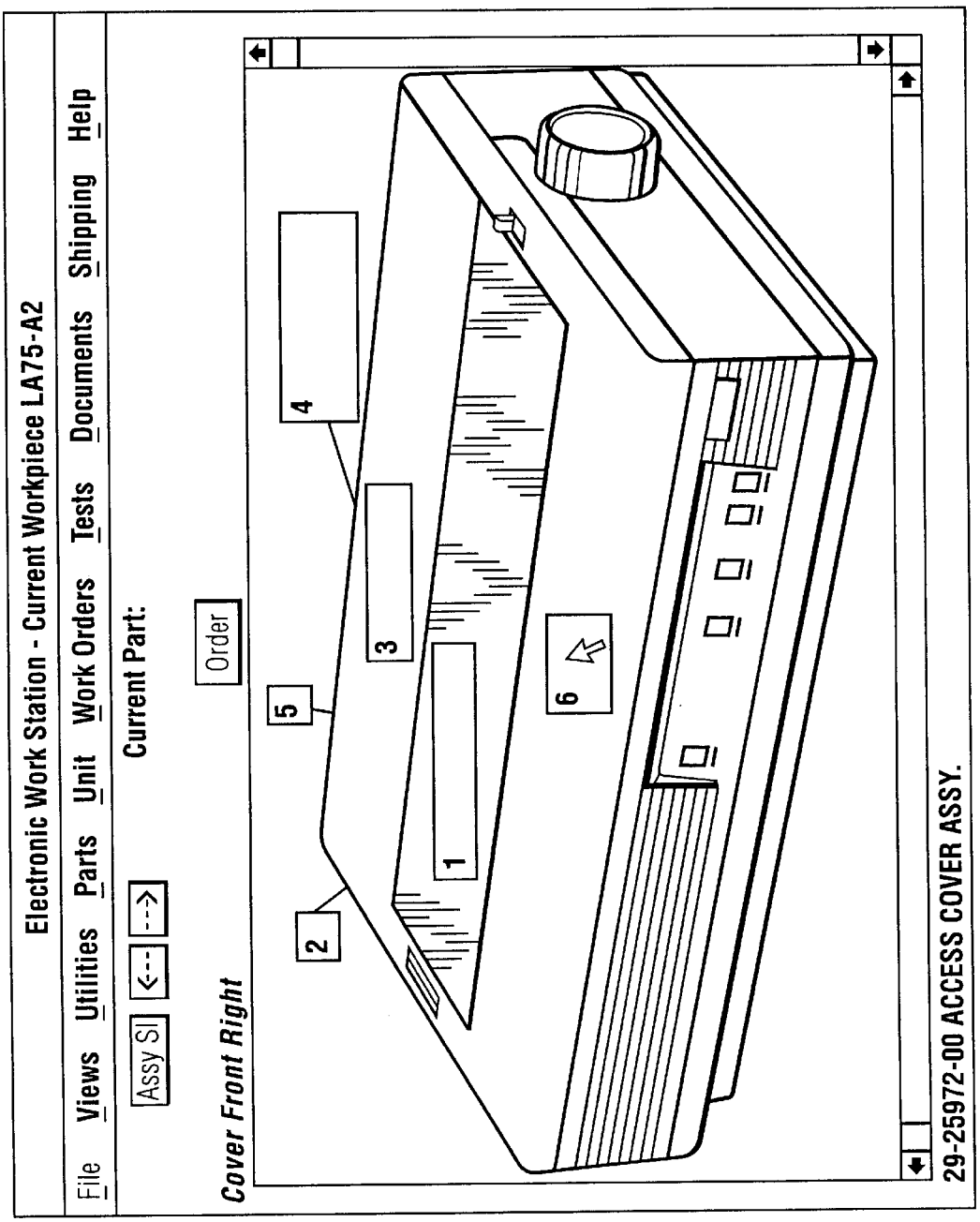
FIG. 5 illustrates the use of "hot spot" graphics that may be advantageously used in accordance with a preferred embodiment of the present invention.

Assume for example that the operator selects from the Views menu the "Cover rear right" view option. The work station computer then generates the work station display screen images shown in FIG. 5. The cover right rear view bitmap shows the appropriate rear view of the LA75-A2 printer as well as a number of hot spots (shown in the Figure as rectangles) identifying various component parts of the printer best examined from this particular view. As described above, these hot spots are overlaid on top of the basic bitmap image of the printer. In FIG. 5, the pointer/cursor has been moved over hot spot 6. Computer 52 detects the cursor position as being within the hot spot 6 coordinate boundaries and generates the corresponding part name displayed in the upper left hand corner "cover rear right" as well as the part number/name 29-25972-00/Access Cover Assembly. Thus, by simply moving a cursor over top of a particular hot spot corresponding to a component in the workpiece, the operator is apprised immediately of the current view of the workpiece (the rear view in this example) as well as the part number and name. By choosing appropriate views, the operator can familiarize himself with the workpiece both internally or externally without ever having the physical workpiece in front of him and without having to remove any lids, covers, or other components to view the internal configuration and parts of the workpiece. Other text and/or graphics may of course be associated with a particular hot spot to assist the operator in identifying a part, a problem, and/or a solution. Part history, part details, related parts and views, as well as other information may also be provided.

Figure 6:
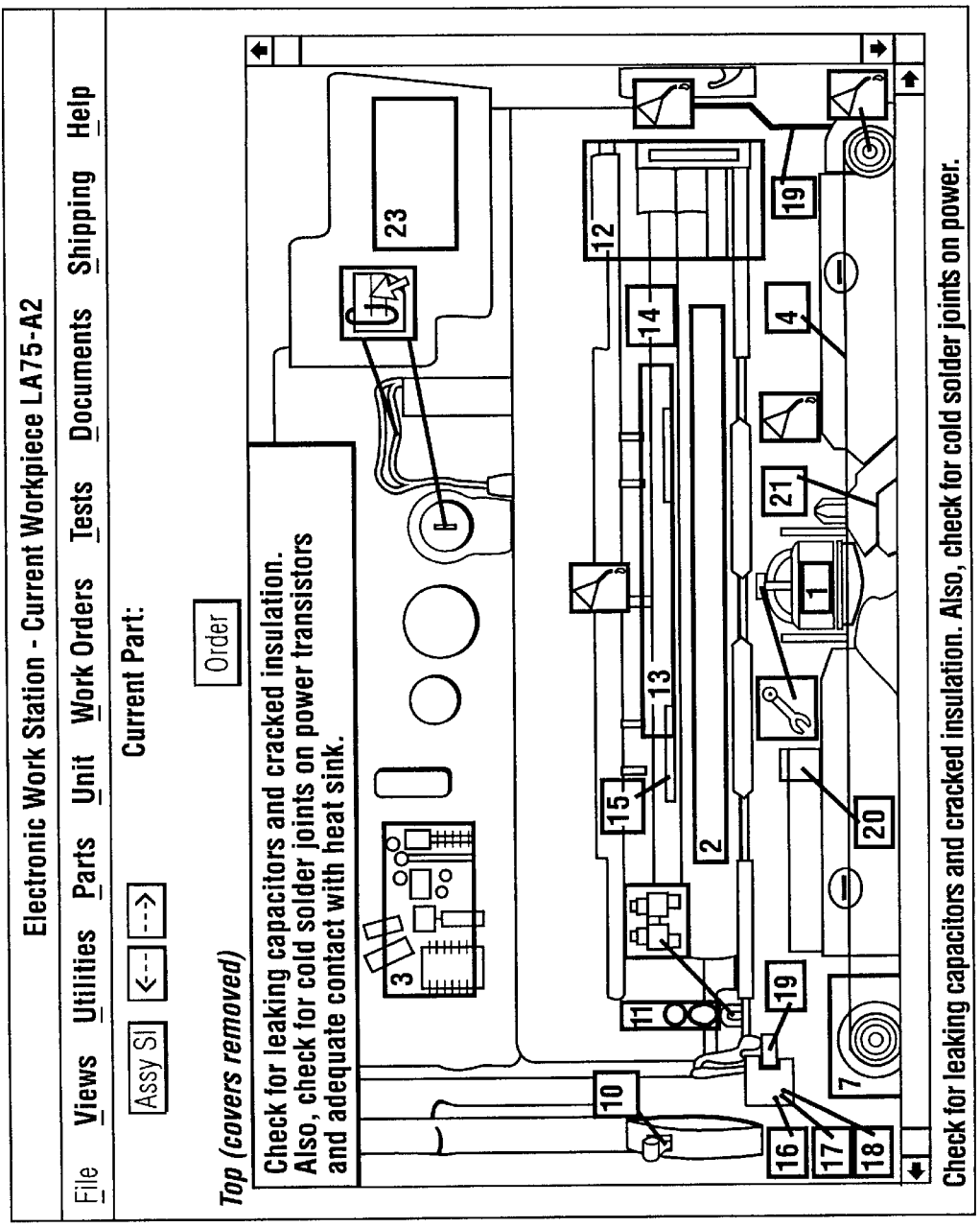
FIG. 6 illustrates an example use of a note icon that may be advantageously used in accordance with a preferred embodiment of the present invention.

FIG. 6 illustrates a work station display screen that shows a view of printer LA75-A2 corresponding to view menu selection "Top (Covers Removed)" as indicated in text in the upper left hand corner of the display screen. This bitmap image of the top view of the printer view is considerably more detailed than the printer view shown in FIG. 5. In this example, the operator has moved the cursor pointer over a "Note" icon. In response, the work station computer generates a text note relevant to the particular part or parts associated with that "Note" icon by the leader line, e.g., "check for leaking capacitors and cracked insulation." In this way, the operator is immediately prompted to investigate certain areas and/or components of the printer that may require maintenance, repair, or other service.

The hot spots and icons are advantageous because they graphically remind or prompt an operator who may or may not have experience repairing a particular workpiece to take appropriate action without unnecessarily cluttering up the display screen with overwhelming amounts of text messages. An operator need not know then names of any parts, problems, services, repairs, or tests. No knowledge of computer-based commands is necessary. The operator need only move a cursor to an icon or hot spot area coincident to an image of the part of the workpiece on which the operator is focused to obtain helpful relevant information and instruction. Hot spots and icons provide unskilled operators with a user-friendly interface to this relevant information and instruction in an easily understood and accessible way so that they can perform their tasks with effectiveness and efficiency.

Figure 7:
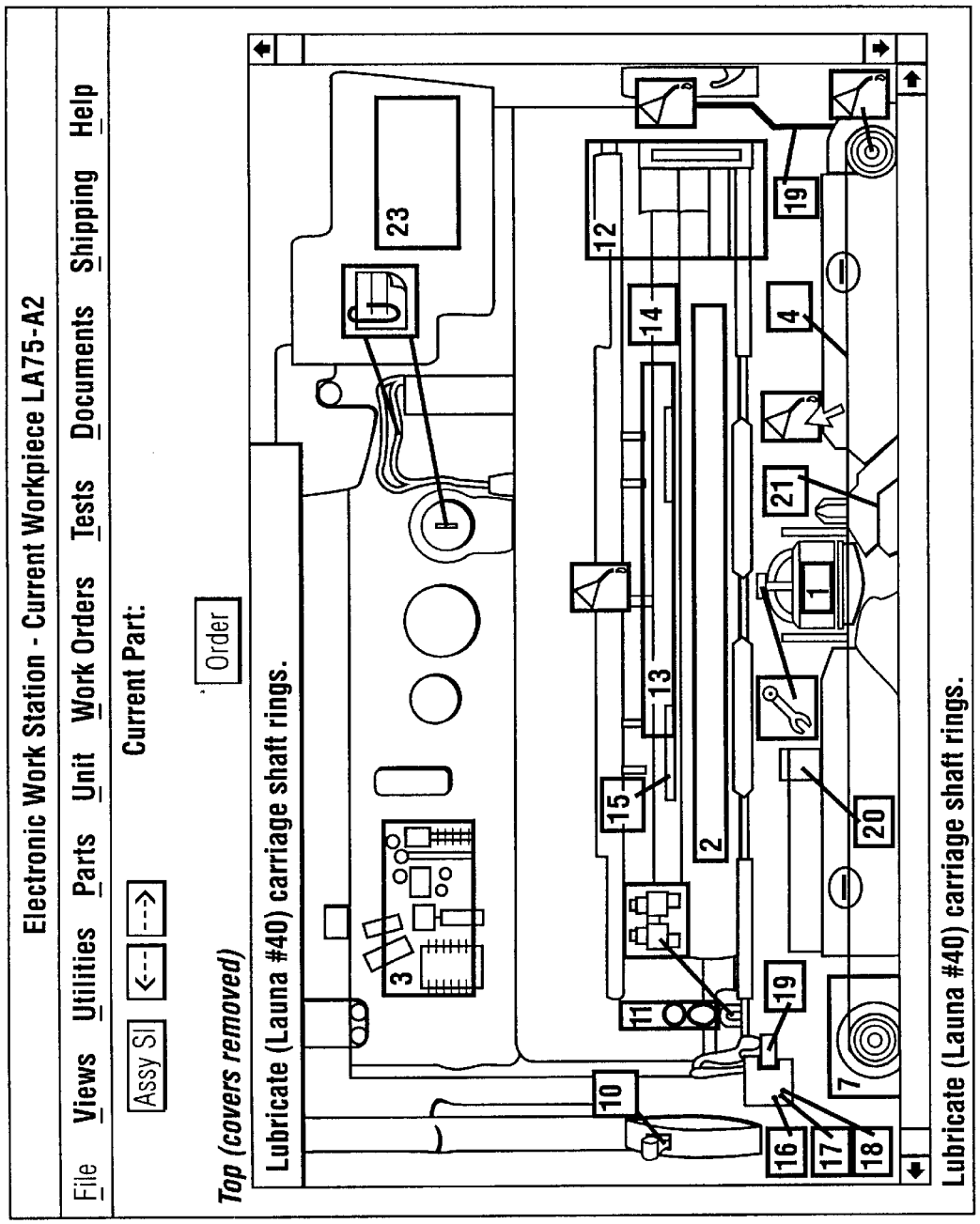
FIG. 7 illustrates an example lubrication icon that may be advantageously used in accordance with a preferred embodiment of the present invention.
Figure 8:
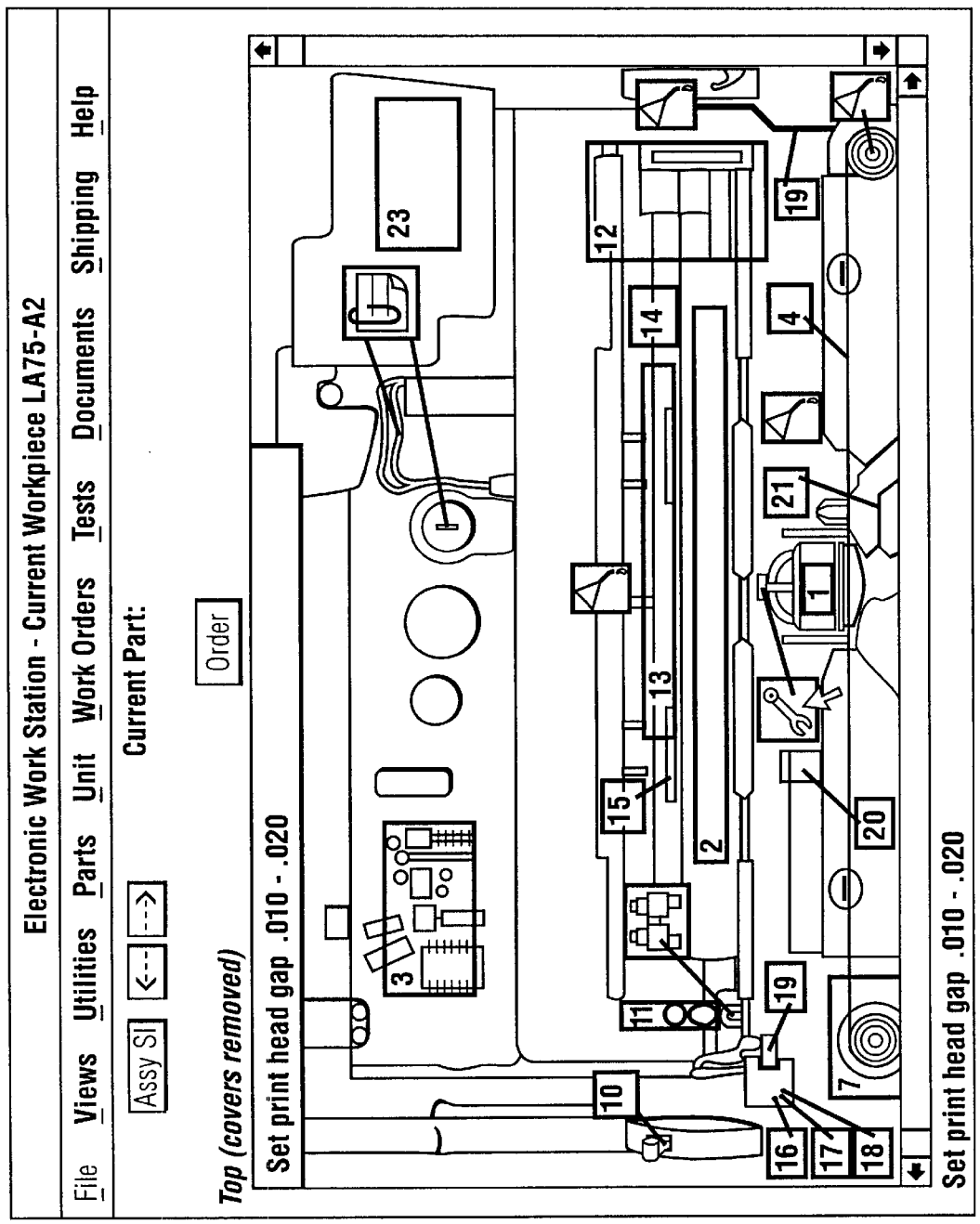
FIG. 8 illustrates an example adjustment icon that may be advantageously used in accordance with a preferred embodiment of the present invention.

FIG. 7 illustrates on the work station display screen the same bitmap image of the top of the printer with the covers removed but in this figure the pointer is located over the Lubrication icon shown as an oil can. Again the work station computer 50 detects that the pointer over the Lubrication icon and displays an appropriate lubrication instruction for the printer component associated with the icon on the display screen: "Lubricate (Launa#40) carriage shaft rings." Similarly, in FIG. 8, the cursor is moved by the operator over the Adjustment icon shown in the figure as a wrench icon. As a result, work station computer 50 generates an adjustment instruction where print head component display image attached by leader line to the wrench icon: "Set print head gap 0.010–0.020."

Figure 9:
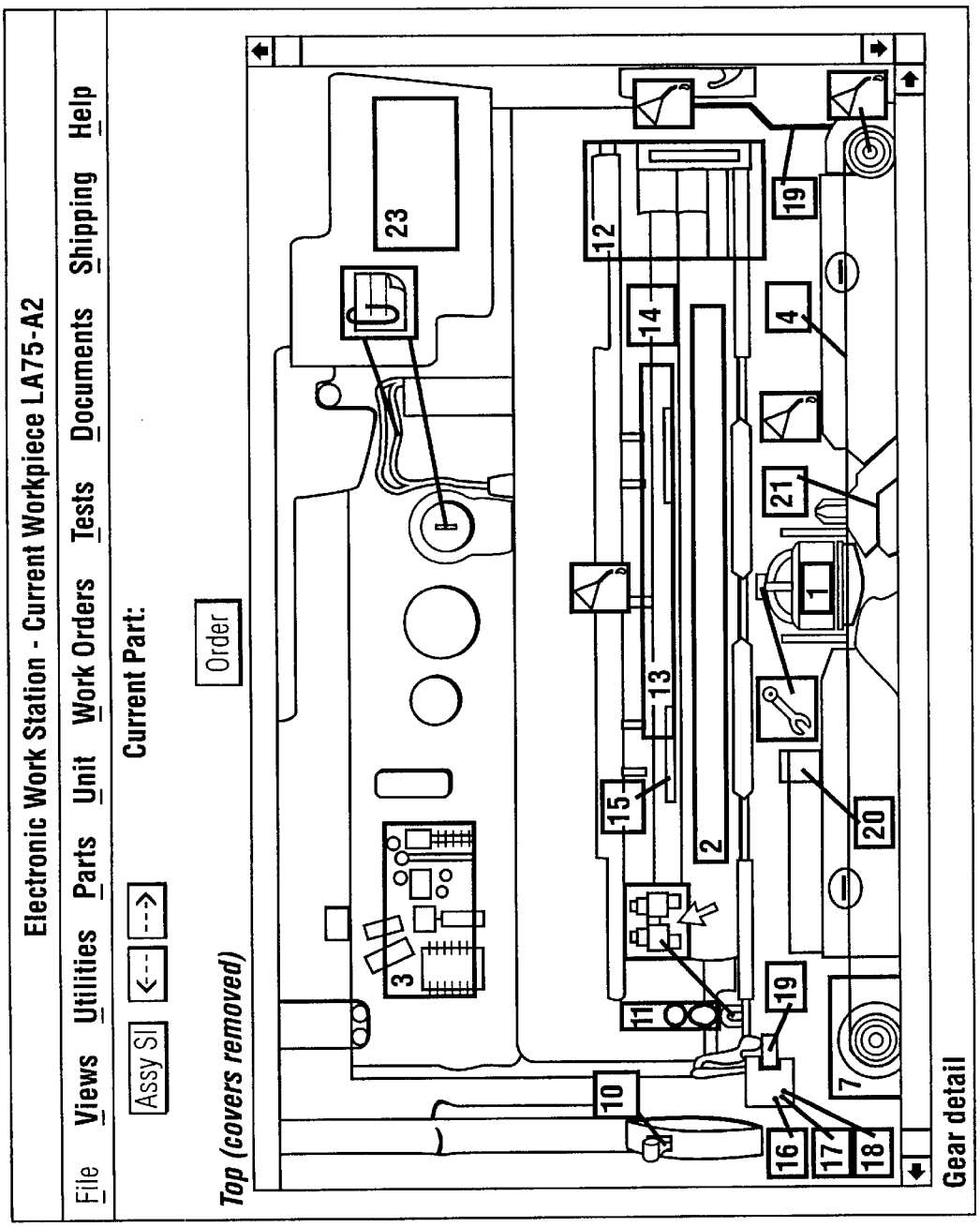
FIG. 9 illustrates an example zoom icon to permit enlarged views of specific parts or areas of the workpiece being serviced that may be advantageously used in accordance with a preferred embodiment of the present invention.
Figure 10:
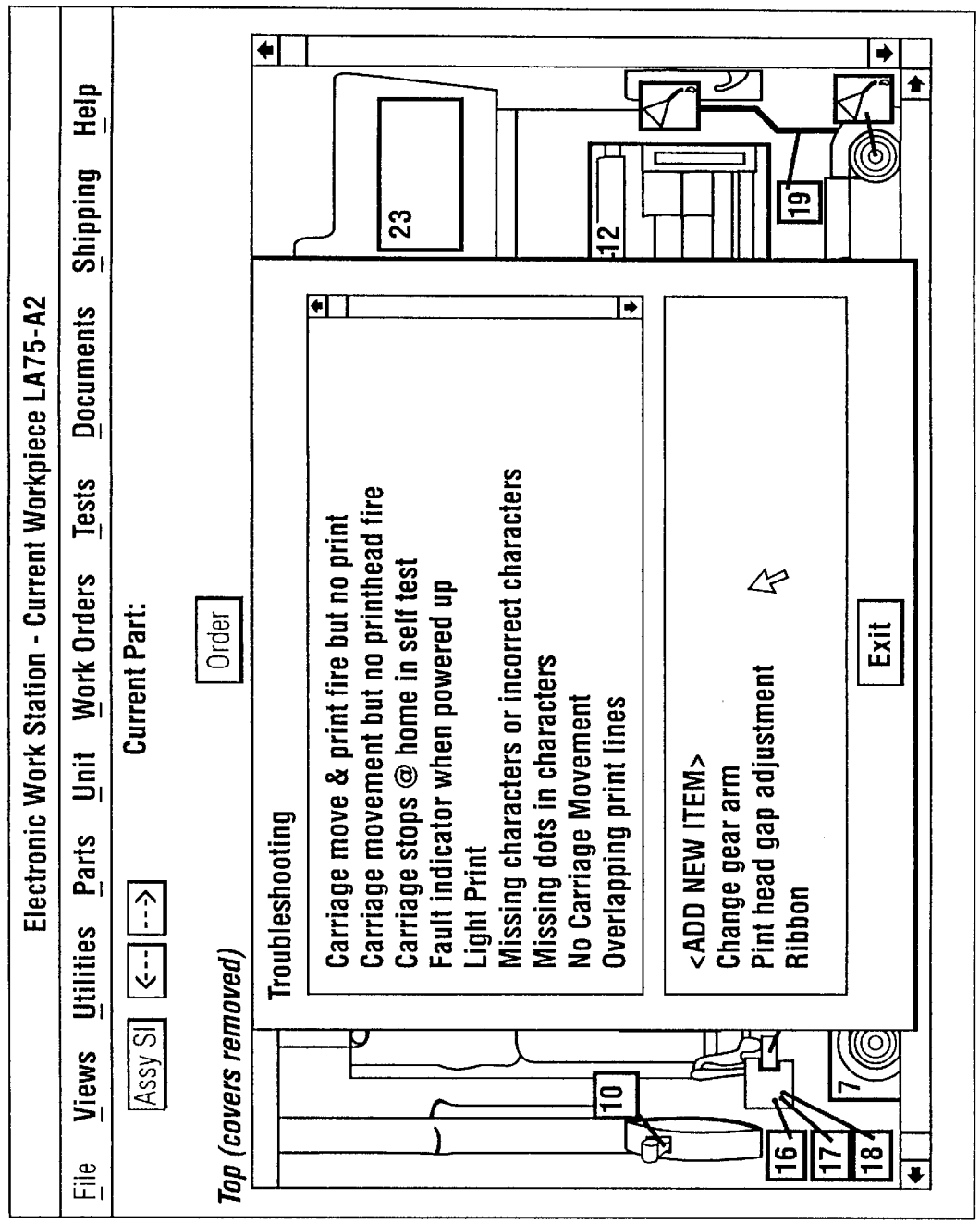
FIG. 10 illustrates an example troubleshooting list that may be advantageously used in accordance with a preferred embodiment of the present invention.

FIG. 9 illustrates the cursor over a Zoom icon shown as a pair of binoculars. The Binoculars icon is connected by a leader line to printer gears and the corresponding text comment is "Gear detail." By clicking on the icon, the "Gear detail" bitmap listed in the Views menu is immediately accessed and displayed to permit the operator to view the details of those gears. Thus, an operator can access more detailed bit maps directly from the current view without having to review the Views menu and without having to take apart the printer in order to expose the printer gears.

In the process of service, repairing, testing, or otherwise maintaining the LA75-A2 printer, the operator may at any time click on the various items in the main menus. For example in FIG. 10, the operator had selected via the unit menu the troubleshooting menu option. As a result, the computer 50 displays a troubleshooting list which provides a list of potential problems with the LA75-A2 printer in general rather than individual problems which might be broken down by specific component parts of that printer. Also shown in the drawing is an "Add New Item" list. Selecting the "Add New Item" entry on the list prompts the user to provide a new solution for the selected problem. This new solution is added to the repair history as well as to the troubleshooting database.

To obtain troubleshooting information from the database for a specific workpiece like a printer, the workpiece ID is the key into the database matrix of problems and solutions. A list of problems is linked to a particular workpiece ID. Although the problems and solutions themselves are independently maintained in separate database tables so as to reduce redundant information, the matrix of problems/solutions is workpiece ID dependent. The matrix includes three fields: the workpiece ID, the problem ID, and a solution ID. The problem ID and the solution ID are keys into the respective tables containing the associated text.

Accordingly, electronic support and service work station in accordance with the present invention provides a number of advantageous features including for example:

Multiple display views of workpiece images along with "hot spot" graphics for identification of various workpiece parts, text notes embedded in the workpiece image, and graphical icons provide the operator with immediate, easy to understand graphical information and guidance.

Relational databases present to the operator only that information necessary for the workpiece currently being serviced.

Access to documents and other information provided through a graphic user interface comprising menus and other objects which facilitates selection and performance of desired tasks.

A troubleshooting database with helpful troubleshooting information to which an operator may add his/her own knowledge of corrective actions for specific problems.

Simplified and coordinated inventory, parts ordering, and other order processing transactions, including automatic collection and maintenance of labor history records, repair history records, audit history records, and other useful informational records.

On-line access to documentation using a comprehensive database architecture.

The above description has been provided with respect to one example embodiment of the present invention. However, numerous modifications and substitutions may be made without deviating from the scope of the invention. For example, the electronic maintenance, repair, testing, and servicing system 10 shown in FIG. 1 disclosed in the context of a network. The present invention may also be implemented in a stand alone work station. In a stand-alone implementation, the necessary database, document, and image files would be stored at the work station itself. Of course, the work station would not interact with the transaction server which means that some functions would not be performed as described above, e.g., work order validation and parts ordering. However, desired parts could be queried into a file for transmission or delivery to a supply parts source. As mentioned above, the present invention may also be programmed to perform various applications in addition to repair, maintenance, testing, and servicing. The types of hot spots and icons described in the above printer example are in no way exhaustive or limiting. Indeed, other text, graphics, or combinations thereof may be used. Therefore, the invention has been disclosed by way of illustration and not limitation, and reference should be made to the following claims to determine the scope of the invention.

What is claimed is:

1. In a computer-controlled electronic support system including an electronic work station including a display screen and pointing device coupled to a central processing unit where an operator performs an operation on a workpiece, a method comprising the steps of:

in response to a user selection, displaying a first one of plural different images of the workpiece to assist the operator in performing the operation on the workpiece;

displaying on the displayed first workpiece image a plurality of graphics associated with the first workpiece image;

using the pointing device to select one of the graphics; and in response to selection of one of the graphics, displaying information on the display screen relating to the workpiece corresponding to the selected graphic that will assist the operator in performing the operation on the workpiece.

2. The method in claim 1, further comprising:

monitoring the location on the display screen pointed to by the pointing device to determine if one of the graphics is selected.

3. The method in claim 1, wherein the graphics include icons, with each icon corresponding to a particular function to be performed on the workpiece, and wherein each icon assumes a shape that identifies the particular function.

4. The method in claim 3, wherein the icons include an icon that when selected instructs the operator to adjust the workpiece.

5. The method in claim 4, wherein the adjusting icon relates to mechanical adjustments to be made to the workpiece.

6. The method in claim 3, wherein the icons include an icon that when selected instruct the operator to observe some structural or functional aspect of the workpiece associated with the icon.

7. The method in claim 3, wherein the icons include an icon that when selected instruct the operator to service some aspect of the workpiece associated with the icon.

8. The method in claim 7, wherein the selected icon instructs the operator to lubricate frictionally cooperative components of the workpiece.

9. The method in claim 3, wherein the icons include an icon that when selected causes display of a more detailed image of a portion of the displayed workpiece image associated with the icon.

10. The method in claim 3, wherein the workpiece operation includes diagnosing and repairing the cause of a malfunction with the workpiece, and wherein the icons are configured over the image of the workpiece to facilitate diagnosis and repair of the workpiece.

11. The method in claim 1, wherein the graphics include outlined areas of the displayed first workpiece image on the display screen, each outlined area corresponding to a part or component of the workpiece.

12. The method in claim 11, wherein when the operator uses the pointing device to point to one of the outlined areas, a corresponding part or component identifier is displayed.

13. The method in claim 12, wherein the corresponding part or component identifier includes a part or component name and a part or component number.

14. The method in claim 12, wherein the corresponding part or component identifier includes a part or component name and a part or component description.

15. The method in claim 11, further comprising:

using the pointing device to point to one of the outlined areas, and activating the pointing device to electronically order the part or component corresponding to the one outlined area of the display screen.

16. The method in claim 1, wherein in response to a user indication, the method further comprises:

displaying a second one of plural different images of the workpiece, and displaying on the displayed second workpiece image a plurality of graphics associated with the second workpiece image.

17. The method in claim 1, wherein the display screen includes a main menu region and an image display region for displaying selected workpiece images, and wherein the method comprises the steps of:

selecting with the pointing device one of the menu entries;

displaying a list of each of the plural different images of the workpiece as an image menu option;

selecting one of the image menu options corresponding the workpiece image to be displayed; and displaying workpiece image and associated graphics corresponding to the selected image menu option.

18. The method in claim 17, wherein another of the menu entries is a troubleshooting menu entry for assisting the operator with diagnosing a problem with the workpiece and providing a suggested solution to the diagnosed problem, the method including the steps of:

identifying a type of the workpiece;

displaying a first list of potential problems relevant to the identified workpiece type;

selecting one of the potential problems; and displaying a second list of potential solutions related to the selected problem for the identified workpiece type.

19. The method in claim 18, further comprising:

automatically maintaining an electronic history of operations performed on the workpiece at the electronic work station including a solution selected from the second list used to solve a problem identified with the workpiece.

20. The method in claim 19, further comprising:

adding a new solution to the second list if the new solution used by the operator to solve a problem identified with the workpiece is not on the second list.

21. In a computer-controlled electronic support system including an electronic work station including a display screen and pointing device coupled to computer where an operator performs an operation on a workpiece, a method comprising the steps of:

beginning the workpiece operation at the electronic work station by entering and processing a work order identifier;

in response to the work order identifier processing, generating a corresponding workpiece identifier;

retrieving from memory image and other information linked to the workpiece identifier;

displaying on one area of the display screen, a menu with plural entries, each entry having menu options that are associated with the workpiece identifier;

selecting a first menu entry and listing a number of menu options, each option corresponding to one of plural different images of the workpiece, and displaying a first one of the plural different images of the workpiece corresponding to a selected one of the options on a second area of the display screen;

displaying on the displayed first workpiece image a plurality of graphics associated with the first workpiece image;

using the pointing device to select one of the graphics; and in response to selection of one of the graphics, displaying information on the display screen relating to the workpiece corresponding to the selected graphic that will assist the operator in performing the operation on the workpiece.

22. The method in claim 21, wherein the other information linked to the workpiece identifier includes troubleshooting information relevant to the type of the workpiece and includes a first list of potential problems relevant to the identified workpiece type, a second list of potential solutions related to the selected problem relevant to the identified workpiece type, and a third list of valid parts for the identified workpiece type.

23. The method in claim 22, further comprising:

electronically ordering from the electronic work station one or more parts for performing the workpiece operation, and delivering the ordered part to the electronic work station.

24. The method in claim 23, further comprising:

maintaining an electronic inventory workpieces and ordered parts, and automatically updating the electronic inventory when operations on a workpiece are completed or when a part is ordered.

25. The method in claim 23, further comprising:

automatically maintaining an electronic history of actions taken by the operator since the beginning step including labor time to perform the workpiece operation, troubleshooting information employed to perform the workpiece operation, parts used to perform the workpiece operation, and results of any auditing operation conducted after the workpiece operation is completed.

26. The method in claim 25, further comprising:

displaying the current electronic history for the workpiece during the workpiece operation.

27. An electronic work station used by an operator in performing an operation on a workpiece, comprising:

a display having a display screen displaying text and graphic information;

a pointing device permitting the operator to move a cursor on the display screen;

a memory storing different images of the workpiece associated with the workpiece, graphics associated with each workpiece image, and text messages associated with the workpiece;

data processing circuitry performing the following tasks:

in response to an operator indication, retrieving from the memory and displaying a first one of the different images of the workpiece to assist the operator in performing the operation on the workpiece;

displaying on the displayed first workpiece image plural graphics associated with the first workpiece image;

using the pointing device to select one of the graphics; and in response to selection of one of the graphics by the pointing device, displaying information relating to the workpiece corresponding to the selected graphic that will assist the operator in performing the operation on the workpiece.

28. The electronic work station in claim 27, wherein the memory stores for plural different workpieces, different images of each workpiece associated with the workpiece, graphics associated with each workpiece image, and text messages associated with each workpiece.

29. The electronic work station in claim 28, wherein each workpiece includes a workpiece identifier, and wherein images, graphics, and text messages associated with each workpiece are linked in memory and accessed from memory by the data processing circuitry using the workpiece identifier.

30. The electronic work station in claim 29, wherein the workpiece identifier is identified at the beginning of the workpiece operation.

31. The electronic work station in claim 27, wherein the graphics include icons, with each icon corresponding to a particular function to be performed on the workpiece, and wherein each icon assumes a shape that identifies the particular function.

32. The electronic work station in claim 31, wherein the icons that when selected instruct the operator to adjust the workpiece.

33. The electronic work station in claim 32, wherein the adjusting icon relates to mechanical adjustments to be made to the workpiece.

34. The electronic work station in claim 31, wherein the icons include an icon that when selected, instructs the operator to observe some structural or functional aspect of the workpiece associated with the icon.

35. The electronic work station in claim 31, wherein the selected icon instructs the operator to lubricate frictionally cooperative components of the workpiece.

36. The electronic work station in claim 31, wherein the icons include an icon that when selected causes display of a more detailed image of a portion of the displayed workpiece image associated with the icon.

37. The electronic work station in claim 31, wherein the workpiece operation includes diagnosing and repairing the cause of a malfunction with the workpiece, and wherein the icons are configured over the image of the workpiece to facilitate diagnosis and repair of the workpiece.

38. The electronic work station in claim 27, wherein the graphics include outlined areas of the displayed first workpiece image on the display screen, each outlined area corresponding to a part or component of the workpiece.

39. The electronic work station in claim 38, wherein when the operator uses the pointing device to point to one of the outlined areas, the data processing circuitry detects the position on the display screen being pointed to and displays a corresponding part or component identifier.

40. The electronic work station in claim 39, wherein the corresponding part or component identifier includes a part or component name and a part or component number.

41. The electronic work station in claim 40, wherein the corresponding part or component identifier includes a part or component name and a part or component description.

42. The electronic work station in claim 40, wherein the data processing circuitry, in response to the operator using the pointing device to point to one of the outlined areas and activating the pointing device, electronically orders the part or component corresponding to the one outlined area of the display screen.

43. The electronic work station in claim 27, wherein the data processing circuitry, in response to a user indication, displays a second one of plural different images of the workpiece along with the plural graphics associated with the second workpiece image.

44. The electronic work station in claim 27, wherein the display screen includes a main menu region and an image display region for displaying selected workpiece images, and wherein when the operator selects one of the menu entries, the data processing circuitry displays a list of each of the plural different images of the workpiece as an image menu option.

45. The electronic work station in claim 44, wherein the memory stores troubleshooting information associated with different types of workpieces including lists of potential problems and a list of potential solutions associated with and linked in the memory to each potential problem.

46. The electronic work station in claim 45, wherein another of the main menu entries is a troubleshooting menu entry for assisting the operator with diagnosing a problem with the workpiece and providing a suggested solution to the diagnosed problem, and wherein when the operator selects the troubleshooting menu, the data processing circuitry retrieves from the memory and displays on the display screen the first list of potential problems relevant to the workpiece identifier, and when the operator selects one of the displayed potential problems, retrieves from the memory and displays on the display screen a second list of potential solutions related to the selected problem.

47. A workpiece support system for assisting an operator in performing operations different workpieces, comprising:
a communications network;
a main computer connected to the network including a workpiece transaction server, a database server, and main memory for storing database and image information relating to the workpieces;
a storage area storing spare parts for use in performing support operations on the workpieces; and
plural electronic work stations connected to the network, each work station including:
a display having a display screen displaying textual and graphic information;
a pointing device permitting the operator to move a cursor on the display screen;
a work station computer for performing the following tasks to assist the operator in performing one or more operations on one of the workpieces;
establishing communication over the network with the main computer transaction server to commence the one or more operations on the one workpiece, the transaction server providing a workpiece identifier;
retrieving from the main memory through the database server database and image information associated with the workpiece identifier;
displaying a first one of plural different images of the workpiece to assist the operator in performing the operation on the workpiece;
displaying on the displayed first workpiece image a plurality of graphics associated with the first workpiece image;
in response to selection of one of the graphics by the pointing device, displaying information on the display screen relating to the workpiece corresponding to the selected graphic that will assist the operator in performing the operation on the workpiece.

48. The system in claim 47, wherein the main memory stores a list of all valid parts for each workpiece, the work station computer displaying the valid parts list for the one workpiece and generating a request for one of the spare parts in the storage area over the network in response to the operator selecting the one part from the displayed valid parts list.

49. The system in claim 47, wherein the work station computer maintains an electronic history of actions taken by the operator since the beginning step including labor time to perform the one or more workpiece operations, troubleshooting information employed to perform the one or more workpiece operations, parts ordered to perform the one or more workpiece operations, and results of any auditing operation conducted after the one or more workpiece operations is completed.

* * * * *